US011175587B2

United States Patent
Ge et al.

(10) Patent No.: US 11,175,587 B2
(45) Date of Patent: Nov. 16, 2021

(54) STRIPPER SOLUTIONS AND METHODS OF USING STRIPPER SOLUTIONS

(71) Applicant: Versum Materials US, LLC, Tempe, AZ (US)

(72) Inventors: Jhih Kuei Ge, Chupei (TW); Yi-Chia Lee, Danshu (TW); Wen Dar Liu, Chupei (TW); Chi-Hsien Kuo, Chupei (TW)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 16/144,710

(22) Filed: Sep. 27, 2018

(65) Prior Publication Data

US 2019/0101830 A1 Apr. 4, 2019

Related U.S. Application Data

(60) Provisional application No. 62/565,939, filed on Sep. 29, 2017.

(51) Int. Cl.
*C11D 3/28* (2006.01)
*C11D 3/30* (2006.01)
(Continued)

(52) U.S. Cl.
CPC ............. *G03F 7/425* (2013.01); *B08B 3/08* (2013.01); *C11D 1/72* (2013.01); *C11D 1/722* (2013.01);
(Continued)

(58) Field of Classification Search
CPC ......... C11D 1/72; C11D 1/722; C11D 3/2068; C11D 3/2075; C11D 3/2082;
(Continued)

(56) References Cited

U.S. PATENT DOCUMENTS 5,334,332 A * 8/1994 Lee ...................... B24B 37/042
134/2
5,902,780 A * 5/1999 Lee ...................... B24B 37/042
134/2
(Continued)

FOREIGN PATENT DOCUMENTS

EP 1619557 A1 1/2006
KR 20140113114 6/2019
(Continued)

*Primary Examiner* — Gregory R Delcotto
(74) *Attorney, Agent, or Firm* — William T. Slaven, IV

(57) ABSTRACT

Stripping solutions that may replace an etching resist ashing process are provided. The stripping solutions are useful for fabricating circuits and/or forming electrodes and/or packaging/bumping applications on semiconductor devices for semiconductor integrated circuits with good photoresist removal efficiency and with low silicon oxide etch rate and low metal etch rates. Methods for their use are similarly provided. The preferred stripping agents contain polar aprotic solvent, water, hydroxylamine, corrosion inhibitor, quaternary ammonium hydroxide and optional surfactant. Further provided are integrated circuit devices and electronic interconnect structures prepared according to these methods.

20 Claims, 4 Drawing Sheets

(51) Int. Cl.

| | | |
|---|---|---|
| *C11D 3/34* | (2006.01) | |
| *C11D 3/43* | (2006.01) | |
| *C11D 7/32* | (2006.01) | |
| *C11D 7/50* | (2006.01) | |
| *G03F 7/42* | (2006.01) | |
| *H01L 21/311* | (2006.01) | |
| *H01L 21/02* | (2006.01) | |
| *C11D 3/20* | (2006.01) | |
| *C11D 1/722* | (2006.01) | |
| *C11D 1/72* | (2006.01) | |
| *C11D 3/32* | (2006.01) | |
| *C11D 3/33* | (2006.01) | |
| *B08B 3/08* | (2006.01) | |

(52) U.S. Cl.
CPC .......... *C11D 3/2068* (2013.01); *C11D 3/2075* (2013.01); *C11D 3/2082* (2013.01); *C11D 3/2086* (2013.01); *C11D 3/28* (2013.01); *C11D 3/30* (2013.01); *C11D 3/32* (2013.01); *C11D 3/33* (2013.01); *C11D 3/43* (2013.01); *G03F 7/426* (2013.01); *H01L 21/02057* (2013.01); *H01L 21/31133* (2013.01); *H01L 21/02071* (2013.01)

(58) Field of Classification Search
CPC ........... C11D 3/2086; C11D 3/28; C11D 3/30; C11D 3/32; C11D 3/33; C11D 3/43; B08B 3/08
USPC ....... 510/175, 176, 245, 254, 259, 264, 265, 510/477, 488, 493, 499, 500, 501, 505, 510/506; 134/1.2, 1.3
See application file for complete search history.

(56) References Cited

U.S. PATENT DOCUMENTS

| | | | |
|---|---|---|---|
| 7,528,098 B2 | 5/2009 | Lee et al. | |
| 2004/0147240 A1* | 7/2004 | Igarashi | H03D 7/165 455/302 |
| 2009/0203566 A1* | 8/2009 | Lee | G03F 7/425 510/175 |
| 2009/0227483 A1* | 9/2009 | Liu | G03F 7/425 510/176 |
| 2010/0160200 A1* | 6/2010 | Seki | C11D 1/008 510/175 |
| 2011/0118165 A1* | 5/2011 | Lee | G03F 7/426 510/176 |
| 2011/0311921 A1* | 12/2011 | Egbe | H01L 21/02071 430/323 |
| 2012/0083436 A1* | 4/2012 | Lee | G03F 7/426 510/175 |
| 2012/0295828 A1* | 11/2012 | Egbe | G03F 7/425 510/176 |
| 2013/0161840 A1 | 6/2013 | Pollard et al. | |
| 2015/0252311 A1* | 9/2015 | Takahashi | H01L 21/02052 438/720 |
| 2016/0020087 A1* | 1/2016 | Liu | C11D 11/0047 510/175 |
| 2016/0060584 A1* | 3/2016 | Mizuta | C11D 7/3209 510/175 |
| 2016/0075971 A1* | 3/2016 | Liu | C23G 1/18 510/175 |
| 2016/0122696 A1* | 5/2016 | Liu | C11D 3/0042 257/798 |
| 2016/0179011 A1* | 6/2016 | Agarwal | C11D 7/261 510/176 |
| 2016/0252819 A1 | 9/2016 | Sugishima et al. | |
| 2017/0037344 A1* | 2/2017 | Chang | C11D 7/5013 |
| 2017/0335252 A1* | 11/2017 | Mizutani | C11D 3/43 |

FOREIGN PATENT DOCUMENTS

| | | |
|---|---|---|
| WO | 2009058181 A2 | 5/2009 |
| WO | 2017119350 A1 | 7/2017 |

\* cited by examiner

Fig. 1A
Fig 1B
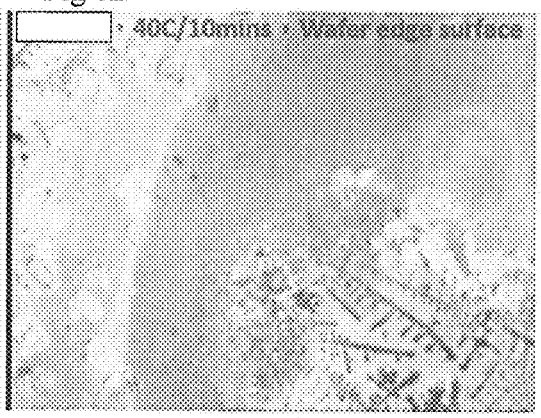
Fig. 2A
Fig. 2B
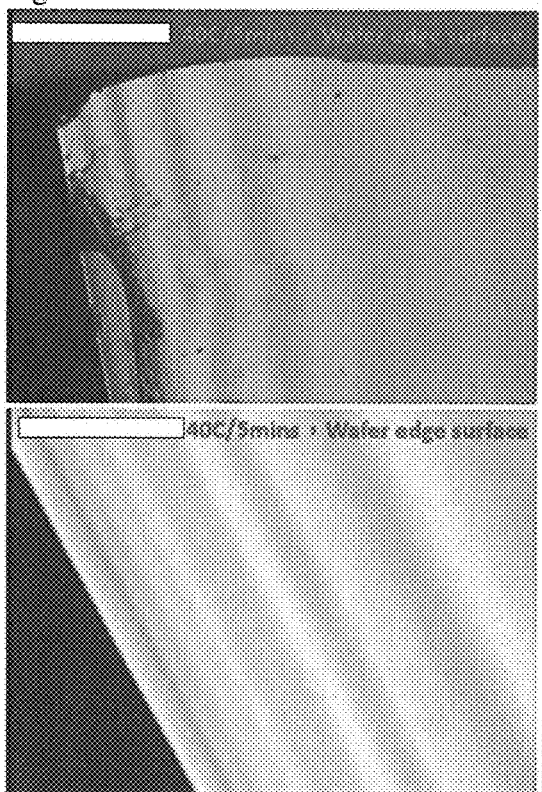
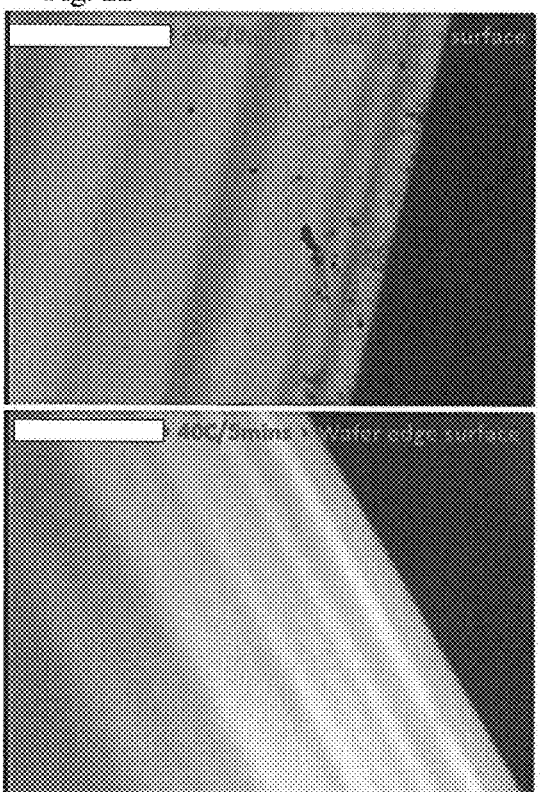
Fig. 2C
Fig. 2D

STRIPPER SOLUTIONS AND METHODS OF USING STRIPPER SOLUTIONS

CROSS-REFERENCE TO RELATED APPLICATIONS

This application claims priority under 35 U.S.C. § 119(e) to U.S. provisional patent application No. 62/565,939, filed on Sep. 29, 2017, the entirety of which is incorporated herein by reference.

BACKGROUND OF THE INVENTION

The present disclosure relates to a stripping agent that may be a back-end-of-line stripping agent for use in the methods of fabricating circuits or forming electrodes and/or packaging/bumping applications on semiconductor devices for semiconductor integrated circuits or liquid crystal displays, semiconductor devices made with the new stripping agent, and further to processes of producing semiconductor devices using the stripping agent and processes for producing the stripping agent.

The technology of fabricating semiconductor integrated circuits has advanced with regard to the number of transistors, capacitors and other electronic devices which can be fabricated on a single integrated circuit chip. This increasing level of integration has resulted in large part from a reduction in the minimum feature sizes of the integrated circuits and an increase in the number of layers which make up the integrated circuit. Today's design features, generally referred to as "sub-micron" have dropped below 0.25 microns. The manufacture of integrated circuit components having this reduced size and the need to reduce production steps has placed new demands on all aspects of their production including the removal of resists and related materials with chemical stripper solutions.

Semiconductor devices for semiconductor integrated circuits or liquid crystal displays are commonly produced by a process including the steps of coating a substrate with one or more layers of polymeric resist materials to provide a resist film; patterning the photosensitive resist film by exposure to light and subsequent development; etching exposed portions of the substrate using the patterned resist film as a mask to form minute circuits; and removing the resist film from the inorganic substrate. Alternatively, after forming minute circuits, the post etch residues can be ashed and the remaining resist residues removed from the substrate with a post etch residue remover. This portion of circuit fabrication is referred to as the back-end-of-line (BEOL) fabrication. What is needed is a stripper solution which can remove remaining photoresists and post etch residues in a single step.

A superior stripper solution should provide one or more of the following benefits: (a) quickly and cleanly remove all resist residues, etch residues and related materials at moderate to low temperatures without requiring a final ashing or post etch removal step, (b) have an acceptable effect on the exposed components on the substrate, particularly the silicon oxide and metals, (c) have a substantial capacity to dissolve and/or suspend resist and/or post etch residue to forestall precipitation and/or re-deposition of solid onto the wafer necessitating the early disposal of the stripper solution, (d) completely remove the photoresist from all surfaces and edges of the substrate or wafer to be cleaned, (e) be safe to use in a manufacturing environment, (f) have an acceptable shelf-life and (g) be backward compatible with lower technology nodes. A superior stripper solution should also quickly remove resist residues in a rework process without substrate damage. Finally, superior stripper solutions should exhibit minimal toxicity. This present disclosure addresses and resolves these needs that may be used in BEOL.

BRIEF SUMMARY OF THE INVENTION

A general object of the present invention is to provide a composition for removing a photoresist, residue, and related materials that can be used in a back-end-of-line operation, a method for utilizing the composition in the manufacture of a semiconductor structure, and a semiconductor structure manufactured utilizing the composition. Preferred embodiments of the composition can be utilized without etching or otherwise damaging metals and/or dielectric material contained in or on the semiconductor structure on the substrate to be cleaned. As used herein, the term "resist" refers to a photoresist or resist material, a post etch residue, or a combination thereof.

One aspect of the present disclosure is a stripper composition which includes one or more than one organic solvent, water, one or more than one hydroxylamine and/or derivative of hydroxylamine or mixtures thereof, one or more than one quaternary ammonium hydroxide, one or more than one corrosion inhibitor and optionally one or more than one surfactant. Suitable quaternary ammonium hydroxides are represented by formula I, provided below:

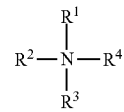

where $R^1$, $R^2$, $R^3$ and $R^4$ are alkyl groups, aryl groups, or a combination thereof having collectively at least 5 carbons. The preferred stripper solutions contain substantially no tetramethylammonium hydroxide, that is they are substantially free of or free of tetramethylammonium hydroxide. The stripper solution also comprises hydroxylamine or derivatives thereof. For some stripper solutions, the organic solvent is polar aprotic solvent, for example, dimethyl sulfoxide (DMSO).

Water content for the preferred solutions generally ranges from about 1 to about 30 wt %, or from about 7 to about 25 wt %, or from about 1 to about 15 wt %, or from about 3 to about 9 wt %. However, the optimum amount of water can vary depending on the selection of the other components and their proportions.

The one or more than one corrosion inhibitor may be any corrosion inhibitor or inhibitors that protect copper including aromatic hydroxyl compounds, acetylenic alcohols, carboxyl group-containing organic compounds and anhydrides thereof, triazole compounds and imidazole compounds or mixtures thereof. The corrosion inhibitor may be benzotriazole, carboxybenzotriazole, amino-benzotriazole, D-fructose, t-butyl catechol, L-ascorbic acid, vanillin, salicylic acid, diethyl hydroxylamine, poly(ethyleneimine), o-tolyltriazole, m-tolyltriazole, p-tolyltriazole or 2-mercaptobenzimidazole or mixtures thereof. The stripper may comprise from about 0.1 to about 15 wt %, from about 0.1 to about 10 wt %, from about 0.5 to about 5 wt %, or from about 0.1 to about 1 wt % of the one or more than one corrosion inhibitors.

In another aspect of the invention, alone or with other aspects, the one or more surfactants, if present, in the composition may be any known surfactant such as amphoteric salts, cationic surfactants, anionic surfactants, zwitterionic surfactants, non-ionic surfactants, and combinations thereof. Several examples of useful surfactants include bis(2-ethylhexyl)phosphate, perfluoroheptanoic acid, prefluorodecanoic acid, trifluoromethanesulfonic acid, phosphonoacetic acid, dodecenylsuccinic acid, dioctadecyl hydrogen phosphate, octadecyl dihydrogen phosphate, dodecylamine, dodecenylsuccinic acid monodiethanol amide, lauric acid, palmitic acid, oleic acid, juniperic acid, 12-hydroxystearic acid and dodecyl phosphate. Examples of useful amounts of surfactants include from about 0.001 to about 15 wt %, or from about 0.1 to about 1 wt %, or from about 0.001 to about 1 wt %, or from about 0.5 to about 5 wt % of said one or more than one surfactant.

For some embodiments, the pH of the composition will be greater than 7, or greater than 8, or greater than 9, or greater than 10, or greater than 11. In some embodiments the pH may be greater than 7, 8, 9, 10 or 11 and less than or equal to 12.2 or 12.

The stripper solutions described herein may be used to remove photoresists, etch residues, and the like in a variety of applications including, but not limited to (i) high dose implant resist removal, (ii) post etch residue in gate formation, (iii) post etch residue in floating gate formation, (iv) re-work applications and (v) back-end-of-the-line applications.

Another object of the present disclosure is to provide a method for removing a resist film from a substrate in a process, which may be a back-end-of-the line (BEOL) process. The method includes the steps of providing a substrate having a component selected from the group consisting of photoresists, photoresist residues, and the like thereon, and contacting the substrate with a composition including the stripper solution, which may be a BEOL stripper solution, to effect removal of the photoresist and related materials. Photoresists, positive or negative photoresists, photoresist residues, and the like are collectively referred to herein as "resists." The resist may be a single layer or bilayer. In addition to resists, etching residues may also be removed. Preferred stripper solutions used in the contacting step include those described above. The step of contacting can involve immersion of a substrate in a stripper solution or by spraying the stripper solution onto the substrate using a spray tool, with or without other cleaning aids such as, for example, megasonics. Further steps following contacting can involve the additional steps of removing the substrate from contact with the stripper solution and/or rinsing the substrate with an appropriate solvent or water. During the contacting step, the stripper solution is preferably maintained at a temperature of at least about 10° C. and more preferably at a temperature ranging from about 15° C. to about 25° C. or 10° C. to 80° C. In some embodiments, the stripper composition is effective without heating the stripper composition, that is, the temperature of the stripper composition may be less than 40° C., or less than 35° C. or less than 30° C. during the contacting step.

Another object of the present disclosure is to provide an electronic interconnect structure prepared in part by removing resists, resist residues, and the like from a substrate having metal components according to the method described above to produce an interconnect structure with a reduced number of etching processes and providing reduced damage to the structure. FIG. 4 illustrates one example of a typical electronic interconnect structure having trenches 1 and 2 interconnected through via 3 within two dielectric layers 5 and 6 separated by a barrier layer 4. Trenches 1 and 2 and via 3 are typically filled with a metal such as copper, aluminum, or alloys containing these metals. Corrosion and/or etching of these metals are typically reduced when the preferred stripper solutions are utilized in the preparation of the electronic interconnects.

Another object of the present disclosure is to provide an integrated circuit device obtainable in part by processing wafers (substrates) containing metal components to remove resist residues according to the method described above with reduced metal etching. FIG. 5 illustrates a typical integrated circuit device having a plurality of computer chips 10 interconnected through chip routers 20.

A still further object of the present disclosure is to provide a method for preparing a stripper solution of this invention by providing a container; providing the components of a stripper solution; and adding the components to the container to provide contents within the container. Providing components can include providing individual components, a composition containing various components, or combinations thereof. Further, adding components of a stripper solution can involve adding individual components, pre-mixed components, and/or a preformed stripper solution containing provided components in substantially any order. Preferred components include one or more than one organic solvent (that may be polar aprotic organic solvent), water, one or more than one hydroxylamine or derivative of hydroxylamine or a mixture thereof, one or more than one corrosion inhibitor, optional one or more than one surfactant and one or more than one quaternary ammonium hydroxide, where the quaternary ammonium hydroxide(s) has the formula:

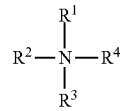

where $R^1$, $R^2$, $R^3$ and $R^4$ are alkyl groups, aryl groups, or a combination thereof having collectively at least 5 carbons. A container can include substantially any vessel capable of holding a stripper solution and includes a typical container used for shipping or transporting a liquid product, equipment used to contain stripper solutions for use processing substrates to remove photoresists and/or etch residues. As used herein a vessel includes equipment used to hold and/or transport a stripper solution during the processing of substrates and includes, but is not limited to, holding and transfer vessels including any pipe system used to transport a stripper solution.

BRIEF DESCRIPTION OF SEVERAL VIEWS OF THE DRAWINGS

FIG. 1A provides an optical microscope (OM) (top view) of wafer edge surface after an unsuccessful cleaning procedure that would be considered not clean (NC).

FIG. 1B provides an OM (top view) of wafer edge surface after an unsuccessful cleaning procedure that would be considered not clean (NC).

FIG. 2A provides an OM (top view) of wafer edge surface after an unsuccessful cleaning procedure that would be considered not clean (NC).

FIG. 2B provides an OM (top view) of wafer edge surface after an unsuccessful cleaning procedure that would be considered not clean (NC), but is better than the cleaning result shown in FIG. 2A.

FIG. 2C provides an OM (top view) of wafer edge surface after an unsuccessful cleaning procedure that would be considered clean (C).

FIG. 2D provides an OM (top view) of wafer edge surface after an unsuccessful cleaning procedure that would be considered clean (C).

DETAILED DESCRIPTION OF THE INVENTION

Figures 3A, 3B:
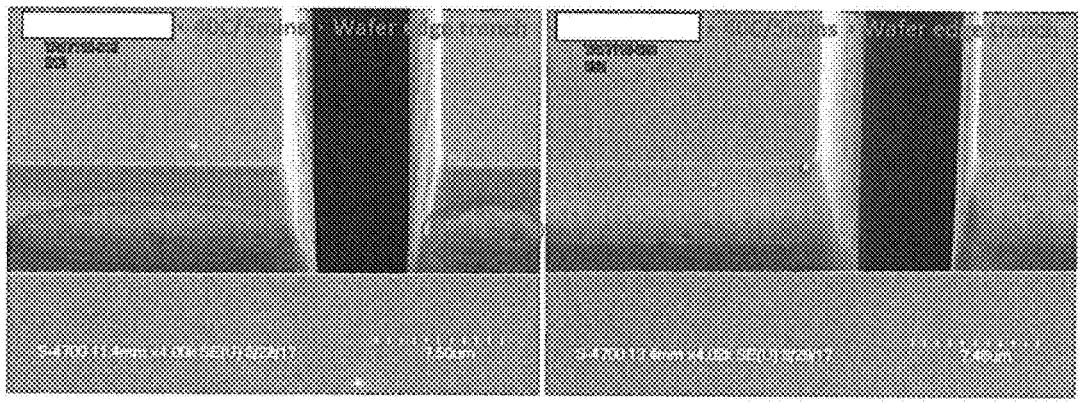
FIG. 3A provides an SEM (tilt view) of wafer edge sidewall after an unsuccessful cleaning procedure that would be considered not clean (NC).
FIG. 3B provides an SEM (tilt view) of wafer edge sidewall after a successful cleaning procedure that would be considered clean (C).

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted and include additional components and method steps. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention. The use of the term "comprising" in the specification and the claims to describe the composition and method includes the more narrow language of "consisting essentially of" and "consisting of" as if they were set forth.

It will be understood that the term "silicon" as deposited as a material on a microelectronic device will include polysilicon.

For ease of reference, "substrate" includes any substrate for a microelectronic device" and corresponds to semiconductor substrates, for examples wafers, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "substrate" is not meant to be limiting in any way and includes any substrate that will eventually become or is part of a microelectronic device, microelectronic assembly or integrated circuit. The substrate may have electronic interconnect structures thereon before or after cleaning with the composition of this invention. The substrate may include any number of materials or layers or portions of layers present on a non-conductive support. The materials may comprise dielectrics, (such as high K dielectrics, and/or low K dielectrics) and/or barrier materials and/or capping materials and/or metal layers and/or others known to persons of skill. The substrates may comprise copper and/or silicon oxide on a non-conductive support.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "high-K dielectric material" refers to a material with a high dielectric constant κ (as compared to silicon dioxide). High-K dielectrics may be used to replace a silicon dioxide gate dielectric or another dielectric layer of a microelectronic device. The high-k material may be hafnium dioxide ($HfO_2$), hafnium oxynitride (HfON), zirconium dioxide ($ZrO_2$), zirconium oxynitride (ZrON), aluminum oxide ($Al_2O_3$), aluminum oxynitride (AlON), hafnium silicon oxide ($HfSiO_2$), hafnium aluminum oxide (HfAlO), zirconium silicon oxide ($ZrSiO_2$), tantalum dioxide ($Ta_2O_5$), aluminum oxide, $Y_2O_3$, $La_2O_3$, titanium oxide ($TiO_2$), aluminum doped hafnium dioxide, bismuth strontium titanium (BST), or platinum zirconium titanium (PZT).

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, and other refractory metals and their nitrides and silicides.

"Substantially free" is defined herein as less than 0.001 wt. %. "Substantially free" also includes 0.000 wt. %. The term "free of" means 0.000 wt. % or less.

As used herein, "about" is intended to correspond to ±5% of the stated value.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed. Unless otherwise defined, all the amounts reported herein are in weight percent based on the total weight of the composition, that is 100%.

As used herein, back-end-of line refers to the part of integrated circuit fabrication where transistors, resistors, and the like are interconnected with the wiring. The portion of fabrication typically begins with patterning for the first metal contact or with deposition of the first layer of metal onto the wafer.

The compositions according to this present disclosure include stripper solution, that may be back end of the line stripper solutions comprising one or more than one organic solvent (that may be one or more than one polar aprotic solvent), water, hydroxylamine or one or more than one derivative of hydroxylamine or mixtures thereof, one or more than one optional surfactant, one or more than one corrosion inhibitor, and one or more than one quaternary ammonium hydroxide. Preferred stripper solutions comprise dimethyl sulfoxide, water, hydroxylamine, surfactant, corrosion inhibitor and quaternary ammonium hydroxide represented by the following formula:

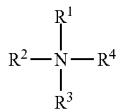

where $R^1$, $R^2$, $R^3$ and $R^4$ are the same or different alkyl groups, aryl groups, or any combination of those groups. In some embodiments $R^1$, $R^2$, $R^3$ and $R^4$ are not all methyl groups. Preferred $R^1$, $R^2$, $R^3$ and $R^4$ are independently selected from ($C_1$-$C_8$) alkyl, benzyl, aryl and combinations thereof. In some embodiments, the number of carbons included in $R^1$, $R^2$, $R^3$ and $R^4$ is at least 5.

Examples of quaternary ammonium hydroxides that may be used in the composition of this invention include one or more than one of ethyl trimethyl ammonium hydroxide, benzyltrimethylammonium hydroxide, tetraethylammonium hydroxide and tetrabutyl ammonium hydroxide. The preferred quaternary ammonium hydroxide is tetraethylammonium hydroxide. Particularly preferred stripper solutions contain less than 0.1 wt % TMAH or are also substantially free or free of tetramethylammonium hydroxide ("TMAH"). A stripper solution that contains less than 0.001 wt % TMAH is considered to be substantially free of TMAH. Free of TMAH is a stripper composition that contains less than 0.000 wt % TMAH. TMAH is suspected of causing injury to the human body. "Substantially free of" also includes "free of". The terms "substantially free of" or "free of" with the same wt % meanings just described will be used below to describe other components that are not present or may only be present in small amounts in the stripper compositions of this invention.

The amount of the one or more than one quaternary ammonium hydroxide (neat) used in the compositions of this invention may be from about 1 wt % to about 10 wt %, or from about 1 wt % to about 20 wt %; or from about 1 to about 7 wt %; or from about 1 to about 5 wt %; or from about 1.2 to about 4.5 wt %; or from about 1.5 to about 4 wt %; or from about 1.75 to about 3.75 wt % of the one or more than one quaternary ammonium hydroxide based on the entire weight of the composition. Additional ranges of the total amount of the quaternary ammonium hydroxide (neat) useful in the composition of this invention may be selected from the following list of endpoints for those ranges: 0.5, 1, 1.2, 1.5, 1.6, 1.75, 2, 2.5, 3, 3.5, 3.75, 3.9, 4, 4.5, 5, 5.5, 7, 10, 12, 15, and 20. One of the aspects of this invention, in some embodiments, is that good cleaning results can be achieved with relatively low amounts of quaternary ammonium hydroxide.

Hydroxylamine or one or more than one of the derivatives of hydroxylamine or mixtures of hydroxylamine and derivative(s) thereof may be used in the compositions of this invention. Derivatives of hydroxylamine include N,N-Diethyl hydroxylamine (DEHA), isopropylhydroxylamine, or salts of hydyoxylamine, such as hydroxylammonium chloride, or hydroxylammonium sulfate. In some embodiments, the derivatives of hydroxylamines and the compositions of this invention are free or substantially free of salts of hydroxylamine. Suitable levels of the required hydroxylamine or derivatives of hydroxylamine or mixtures thereof (neat) may be present in the composition from about 0.1 wt % to about 10 wt %, or from about 0.1 to about 5 wt %; or from about 0.1 to about 3 wt %; or from about 0.1 to about 1.8 wt %; or from about 0.4 to about 1.7 wt %; or from about 0.5 to about 1.5 wt %; or from about 0.3 to about 1.3 wt % based on the total weight of the composition. The hydroxylamine or the one or more than one derivatives of hydroxylamine or mixtures thereof may be present in the composition in an amount (total amount) greater than or equal to 0.001 wt % and less than 2 wt %. In addition to the ranges above, the (total) amount of the hydroxylamine and/or one or more than one derivative of hydroxylamine or mixtures thereof (neat) present in the composition of this invention may be any range having the start and end points from the following list of weight percents: 0.1, 0.2, 0.3, 0.5, 0.7, 0.8, 1, 1.3, 1.5, 1.7, 1.8, 2, 2.4, 2.6, 3, 3.3, 3.6, 4, 4.3, 4.6, 5, 5.5, 6, 6.5, 7, 7.5, 8, 8.5, 9 and 10.

The compositions of this invention comprise water, (DI water or other purified water) from about 1% to about 15% water, or from about 1% to about 30 wt %, or from about 1 to about 10 wt %; or from about 1 to about 8 wt % or from about 3.5 to about 9 wt %; or from about 4 to about 8.5 wt %; or from about 4.4 to about 8 wt %; or from about 4.8 to about 7.6 wt % based on the total weight of the composition. The total amount of water present (added and/or from any source, such as, from an aqueous solution of a component added to the composition) in the stripper composition may be any range having the start and end points from the following list of weight percents: 0.1, 0.2, 0.3, 0.5, 0.7, 0.8, 1, 1.3, 1.5, 1.7, 1.8, 2, 2.4, 2.6, 3, 3.3, 3.6, 4, 4.3, 4.6, 5, 5.5, 6, 6.5, 7, 7.5, 8, 8.5, 9, 10, 15, 20, 25, and 30.

The compositions of the present invention comprise one or more than one organic solvent. Examples of useful solvents include the following list of solvents: dimethylsulfoxide, N-methyl-2-pyrrolidone, N,N-dimethylacetamide, N,N-dimethylformamide, N,N-dimethylimidazole, y-butyrolactone, sulfolane, 2-pyrrolidinone, 1-methyl-2-pyrrolidinone, 1-ethyl-2-pyrrolidinone, 1-propyl-2-pyrrolidinone, 1-hydroxyethyl-2-pyrolidinone, 1-hydroxypropyl-2-pyrrolidinone, diethylene glycol monoalkyl ethers, dialkyl sulfones, tetrahydrothiophene-1,1-dioxides, or polyethylene glycol or mixtures thereof. The preferred solvent is polar aprotic solvent, for example, dimethylsulfoxide. The stripping compositions may contain from about 20 to about 95 wt %, or from about 40 to about 90 wt % solvents, or from about 60 to about 90 wt % solvent(s). Alternatively, the concentrations of the one or more than one organic solvent may range from about 80 to about 98 wt %, or from about 82 to about 96 wt %, or from about 85 to about 95 wt % or from about 86 to about 94 wt %. In addition to the ranges above, the (total) amount of the one or more solvents, added to the composition of this invention may be any range having the start and end points from the following list of weight percents: 20, 30, 40, 50, 60, 70, 80, 81, 82, 83, 84, 85, 86, 87, 88, 89, 90, 91, 92, 93, 94, 95, 97, 98 and 98.5.

The compositions of the present invention further comprise one or more than one corrosion inhibitor. Corrosion inhibitors serve to react with any metal exposed on the substrate surface being etched, particularly copper, or a nonmetal, to passivate the surface and prevent excessive etching during cleaning.

Any corrosion inhibitor(s) known in the art for similar applications may be used as the one or more corrosion inhibitors in the composition of this invention. Examples of corrosion-inhibitors include aromatic hydroxyl compounds, acetylenic alcohols, carboxyl group-containing organic compounds and anhydrides thereof, and triazole compounds, and imidazole compounds.

Exemplary aromatic hydroxyl compounds include phenol, cresol, xylenol, pyrocatechol, resorcinol, hydroquinone, pyrogallol, 1,2,4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, amino resorcinol, p-hydroxybenzoic acid, o-hydroxybenzoic acid, 2,4-dihydroxybenzoic acid, 2-5-dihydroxybenzoic acid, 3,4-dihydroxybenzoic acid and 3,5-dihydroxybenzoic acid.

Exemplary acetylenic alcohols include 2-butyne-1,4-diol, 3,5-dimethyl-1-hexyn-3-ol, 2-methyl-3-butyn-2-ol, 3-methyl-1-pentyn-3-ol, 3,6-dimethyl-4-octyn-3,6-diol, 2,4-7,9-tetramethyl-5-decyne-4,7-diol and 2,5-dimethyl-3-hexyne 2,5-diol.

Exemplary carboxyl group-containing organic compounds and anhydrides thereof include formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, lactic acid, maleic acid, acetic anhydride and salicylic acid.

Exemplary triazole compounds include benzotriazole, o-tolyltriazole, m-tolyltriazole, p-tolyltriazole, carboxybenzotriazole, 1-hydroxybenzotriazole, nitrobenzotriazole and dihydroxypropylbenzotriazole.

Exemplary imidizole compounds include benzimidazole and 2-mercaptobenzimidazole.

In an exemplary embodiment, the one or more than one corrosion inhibitor in the composition of the invention include one or more of benzotriazole, carboxybenzotriazole, amino-benzotriazole, D-fructose, t-butyl catechol, L-ascorbic acid, vanillin, salicylic acid, diethyl hydroxylamine, and poly(ethyleneimine), 2-mercaptobenzimidazole.

In other embodiments, the one or more than one corrosion inhibitor is a triazole and is at least one of benzotriazole, o-tolyltriazole, m-tolyltriazole, and p-tolyltriazole, more preferably the corrosion inhibitor comprises benzotriazole.

It is believed that for most applications, if present, the composition will comprise one or more than one corrosion inhibitor (neat) from about 0.1 to about 15 wt. % of the composition; preferably it comprises from about 0.1 to about 10 wt. %, preferably, from about 0.5 to about 5 wt. %, and most preferably, from about 0.1 to about 1 wt. %, or about 0.5 to about 5 wt. % of the composition. In addition to the ranges above, the composition of this invention may comprise an amount (total amount) of one or more than one corrosion inhibitor (neat) within a range having the start and end points from the following list of weight percents: 0.1, 0.2, 0.25, 0.4, 0.5, 1, 1.5, 2, 2.5, 3, 4, 5, 6, 7, 8, 9, 10 and 15.

The compositions of the present invention may comprise one or more than one optional surfactant. Surfactants useful in the compositions described herein include, but are not limited to, amphoteric salts, cationic surfactants, anionic surfactants, zwitterionic surfactants, non-ionic surfactants, and combinations thereof including, but not limited to, bis(2-ethylhexyl)phosphate, perfluoroheptanoic acid, prefluorodecanoic acid, trifluoromethanesulfonic acid, phosphonoacetic acid, dodecenylsuccinic acid, dioctadecyl hydrogen phosphate, octadecyl dihydrogen phosphate, dodecylamine, dodecenylsuccinic acid monodiethanol amide, lauric acid, palmitic acid, oleic acid, juniperic acid, 12-hydroxystearic acid, dodecyl phosphate.

Non-ionic surfactants useful in the composition include, but are not limited to, acetylene glycol surfactant including Surfynol® 104, 104E, 104H, 104A, 104BC, 104DPM, 104PA, 104PG-50, 104S, 420, 440, 465, 485, SE, SE-F, 504, 61,DF37, CT111, CT121, CT131, CT136, GA, and DF110D. Surfynol® is a registered trademark of Evonik, GmbH); polyoxyethylene lauryl ether (Emalmin® NL-100 (tradename of Sanyo), Brij® 30, Brij 98, Brij 35), dodecenylsuccinic acid monodiethanol amide (DSDA, Sanyo), ethylenediamine tetrakis(ethoxylate-block-propoxylate) tetrol (Tetronic® 90R4), polyethylene glycols (e.g., PEG 400), polypropylene glycols, polyethylene or polypropylene glycol ethers, block copolymers based on ethylene oxide and propylene oxide (Newpole® PE-68 (Sanyo), Pluronic L31, Pluronic 31R1, Pluronic L61, Pluronic F-127), polyoxypropylene sucrose ether (SN008S, Sanyo), t-octylphenoxypolyethoxyethanol (Triton® X100), 10-ethoxy-9,9-dimethyldecan-1-amine (TRITON® CF-32), Polyoxyethylene (9) nonylphenylether, branched (IGEPAL® CO-250), polyoxyethylene (40) nonylphenylether, branched (IGEPAL CO-890), polyoxyethylene sorbitol hexaoleate, polyoxyethylene sorbitol tetraoleate, polyethylene glycol sorbitan monooleate (Tween® 80), sorbitan monooleate (Span 80), a combination of Tween 80 and Span 80, alcohol alkoxylates (e.g., Plurafac® RA-20), alkyl-polyglucoside, ethyl perfluorobutyrate, 1,1,3,3,5,5-hexamethyl-1,5-bis[2-(5-nornbornen-2-yl)pethyl]trisiloxane, monomeric octadecylsilane derivatives such as SIS6952.0 (Siliclad®, Gelest®), siloxane modified polysilazane such as PP1-SG10 Siliclad Glide 10 (Gelest), silicone-polyether copolymers such as Silwet® L-77 (Setre Chemical Company), Silwet ECO Spreader (Momentive), and ethoxylated fluorosurfactants (ZONYL® FSO-100, ZONYL® FSN-100).

Examples of cationic surfactants that may be used in the compositions of the invention alone or with other surfactants include, but are not limited to, cetyl trimethylammonium bromide (CTAB), heptadecanefluorooctane sulfonic acid, tetraethylammonium, stearyl trimethylammonium chloride (Econol TMS-28, Sanyo), 4-(4-diethylaminophenylazo)-1-(4-nitrobenzyl)pyridium bromide, cetylpyridinium chloride monohydrate, benzalkonium chloride, benzethonium chloride benzyldimethyldodecylammonium chloride, benzyldimethylhexadecylammonium chloride, hexadecyltrimethylammonium bromide, dimethyldioctadecylammonium chloride, dodecyltrimethylammonium chloride, hexadecyltrimethylammonium p-toluenesulfonate, didodecyldimethylammonium bromide, di(hydrogenated tallow)dimethylammonium chloride, tetraheptylammonium bromide, tetrakis (decyl)ammonium bromide, Aliquat® 336 and oxyphenonium bromide, guanidine hydrochloride (C(NH2)3Cl) or triflate salts such as tetrabutylammonium trifluoromethanesulfonate, dimethyldioctadecylammonium chloride, dimethyldihexadecylammonium bromide and di(hydrogenated tallow)dimethylammonium chloride (e.g., Arquad® 2HT-75, Akzo Nobel).

Examples of anionic surfactants that may be used in the compositions of the invention alone or with other surfactants include, but are not limited to, ammonium polyacrylate (e.g., DARVAN® 821A), modified polyacrylic acid in water (e.g., SOKALAN CP10S), phosphate polyether ester (e.g., TRITON H-55), decylphosphonic acid, dodecylphosphonic acid (DDPA), tetradecylphosphonic acid, hexadecylphosphonic acid, octadecylphosphonic acid, dodecylbenzenesulfonic acid, poly(acrylic acid sodium salt), sodium polyoxyethylene lauryl ether, sodium dihexylsulfosuccinate, dicyclohexyl sulfosuccinate sodium salt, sodium 7-ethyl-2-methyl- 4-undecyl sulfate (Tergitol 4), SODOSIL RM02, and phosphate fluorosurfactants such as Zonyl FSJ and ZONYL® UR.

Examples of zwitterionic surfactants that may be used in the compositions of this invention alone or with other surfactants include, but are not limited to, acetylenic diols or modified acetylenic diols (e.g., SURFONYL® 504), cocamido propyl betaine, ethylene oxide alkylamines (AOA-8, Sanyo), N,N-dimethyldodecylamine N-oxide, sodium cocaminpropinate (LebonApl-D, Sanyo), 3-(N,N-dimethylmyristylammonio)propanesulfonate, and (3-(4-heptyl)phenyl-3-hydroxypropyl)dimethylammoniopropane-sulfonate. Preferably, the one or more than one surfactant comprises dodecylbenzene sulfonic acid, dodecyl phosphonic acid, dodecyl phosphate, TRITON® X-100, SOKA-LAN® CP10S, PEG 400, and PLURONIC® F-127.

The preferred one or more than one surfactant is non-ionic surfactant, and more preferred surfactants are Surfynol 420, 440, 465, 485, and the most preferred surfactant is Surfynol 485.

When present, the amount of surfactant(s) (neat) may be in a range from about 0.001 to about 1 wt %, preferably from about about 0.1 to about 1 wt %, based on the total weight of the composition. Alternatively, it is believed that for some applications, if present, the one or more than one surfactant will comprise from about 0.1 to about 15 wt. % of the composition; or from about 0.1 to about 10 wt. %, or from about 0.5 to about 5 wt. %, or from about 0.1 to about 1 wt. %, or about 0.5 to about 5 wt. % of the composition. In alternative embodiments the (total) weight percent of surfactant(s) (neat) in the composition, based on the total weight of the composition may be within any range having start and end points selected from the following: 0.001, 0.01, 0.025, 0.05, 0.08, 0.1, 0.15, 0.2, 0.5, 1, 2, 5, 10 and 15.

In some embodiments, the compositions of this invention will be free of or substantially free of one or more than one of the following, or free of any additional of the following if already present in the composition: alkanolamines, alkyl ethers of alkonolamines, ethers, alcohols, fluorine-containing compounds, metal-containing compounds, oxides, organic acids and TMAH. In other embodiments, the composition will be substantially free of (or free of) sodium, and/or calcium, and/or amino carboxylic acids, and/or alcohols and/or glycol and/or glycol ethers, and/or ethylene diamine, and/or ethylene triamine, and/or thiophenol. In some embodiments, the compositions disclosed herein are formulated to be substantially free of at least one of the following chemical compounds: inorganic acids, alkyl thiols, and organic silanes. In some embodiments, the compositions disclosed herein are formulated to be substantially free or free of inorganic bases. In some embodiments, the composition may be substantially free of or free of one or more of the following: hydroxides, metal hydroxides, such as KOH or LiOH or NaOH. In other embodiments, the composition may be substantially free of or free of a halide-containing compound, for example it may be substantially free or free of one or more of the following: fluoride-, bromine-, chlorine- or iodine-containing compounds. In other embodiments, the composition may be substantially free or free of sulfonic acid and/or phosphoric acid and/or sulfuric acid and/or nitric acid and/or hydrochloric acid. In other embodiments, the composition may be substantially free or free of sulfates and/or nitrates and/or sulfites and/or nitrites. In other embodiments, the composition may be substantially free or free of: ammonium hydroxide and/or ethyl diamine. In other embodiments, the composition may be substantially free or free of: sodium-containing compounds and/or calcium-containing compounds and/or manganese-containing compounds or magnesium-containing compounds and/or chromium-containing compounds and/or sulfur-containing compounds and/or silane-containing compounds and/or phosphorus-containing compounds. Some embodiments may be substantially free of or free of surfactants. Some embodiments may be substantially free or free of amphoteric salts, and/or cationic surfactants, and/or anionic surfactants, and/or zwitterionic surfactants, and/or non-ionic surfactants. Some embodiments may be substantially free of or free of alkanolamines, and/or imidizoles, and/or anhydrides. Some embodiments may be substantially free of or free of pyrrolidones, and/or acetamides. Some embodiments may be substantially free or free of any amines other than the hydroxylamine or derivatives thereof. Some embodiments may be substantially free of or free of oxidizing agents. Some embodiments may be substantially free of or free of peroxy-compounds, and/or peroxides, and/or persulfates, and/or percarbonates, and acids thereof, and salts thereof. Some embodiments may be substantially free of or free of iodates, and/or perboric acid, and/or borates, and/or percarbonates, and/or peroxyacids, and/or cerium compounds, and/or cyanides, and/or periodic acid and/or ammonium molybdate, and/or nitric acid, and/or ammonia. The components that the compositions of this invention may be free of may be in any combination of components as if all of the combinations were set forth herein.

The composition of the present invention may also include one or more of the following additives: chelating agents, chemical modifiers, dyes, biocides, and other additives. The additive(s) may be added to the extent that they do not adversely affect the performance of the composition, typically in amounts up to a total of about 5 weight % of the composition. In other embodiments the composition will be substantially free of or free of chelating agents, dyes, biocides and other additives.

Preferred temperatures of at least 30° C. are preferred for contacting the substrate whereas for a majority of applications, temperatures of from about 40° C. to about 50° C. are more preferred. For particular applications where the substrate is either sensitive or longer removal times are required, lower contacting temperatures are appropriate. For example, when reworking substrates, it may be appropriate to maintain the stripper solution at a lower temperature for a longer time to remove the photoresist and avoid damaging to the substrate, such as the lower temperatures described earlier. If longer contact times are required for complete resist removal, placing a blanket of dry nitrogen over the stripper solution can reduce water uptake from the atmosphere and maintain the dry stripper solution's improved performance.

When immersing a substrate, agitation of the composition additionally facilitates photoresist removal. Agitation can be effected by mechanical stirring, circulating, by bubbling an inert gas through the composition, or any combination thereof. Upon removal of the desired amount of resist film, the substrate is removed from contact with the stripper solution and may be rinsed in one or more steps with liquid comprising water, an alcohol, or a mixture thereof. DI water is a preferred form of water and isopropanol is a preferred alcohol. For substrates having components subject to oxidation, the one or more rinsing steps can be done under an inert atmosphere. The preferred stripper solutions according to the present disclosure have improved loading capacities for photoresist materials compared to current commercial products and are able to process a larger number of substrates with a given volume of stripper solution. As used herein, loading capacity refers to the ability of a stripper solution to dissolve, suspend, or otherwise avoid precipitation and/or re-deposition of a solid onto a wafer being cleaned.

In addition to immersion techniques, wafers can also be contacted with a stripper solution utilizing a spray device with the stripper solution maintained at the desired temperature. The spraying can optionally be carried out using additional cleaning aids including ultrasonics and/or under an inert atmosphere or optionally in the presence of an active gas such as, for example, oxygen or ozone. The wafer can be removed periodically and inspected to determine when sufficient cleaning has occurred. The clean wafer can be rinsed in one or more rinsing step as described above, for example, with isopropanol and then dried. This method can be used to remove multiple layers of resist and as a cleaning step.

The typical process used in manufacturing a wafer may comprise the following steps:
contacting (by immersion or spraying or both) the wafer to be cleaned, in a single wafer tool or multi-wafer bath, wherein the temperature of the composition during the contacting step may be as earlier described or as in one embodiment about 40° C. or from about 40 to 50° C. The contacting step should occur for 5 minutes or less, or 30 seconds to 5 minutes or 30 seconds to 10 minutes. Ending the contact of the wafer to the composition by removing the wafer from the cleaning composition or stopping the spray and rinsing the wafer with DI water, for example, for about 2 minutes, and then drying the wafer by directing nitrogen gas ($N_2$) at the wafer or spinning the wafer or both simultaneously or consecutively. The desired results are complete removal of the photoresist and in the preferred embodiments the silicon oxide etch rate should be less than 0.2 A/minute, and the copper etch rate should be less than 5 A/min.

EXAMPLES

All compositions which are the subject of the present Examples were prepared by mixing the components in a 150 mL beaker with ½" round Teflon stir bar at 600 rpm. The order of the materials added to the beaker was as follows: deionized (DI) water, if separately added, then one or more than one solvent, then one or more than one quaternary ammonium hydroxide, then hydroxylamine or one or more than one derivative of hydroxylamine or mixtures thereof, then one or more than one optional surfactant, and then one or more than one corrosion inhibitor.

Figure 6:
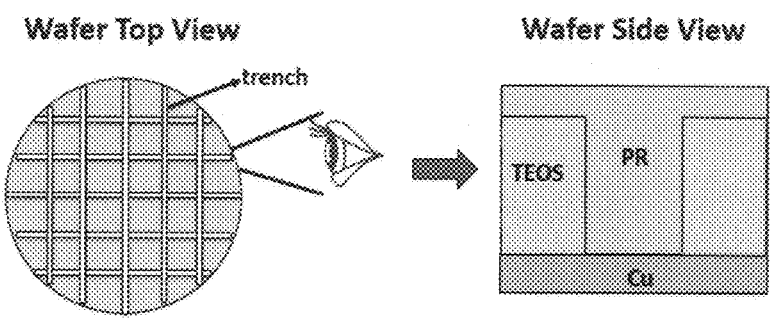
FIG. 6 are a top view and side view of the wafers used to make the test coupons used in the examples.
Figure 4:
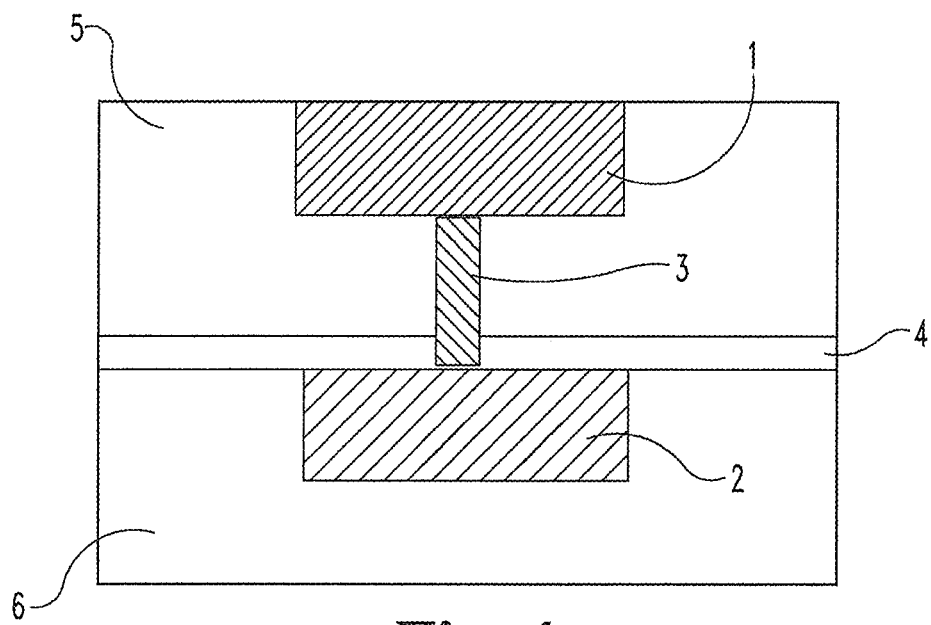
FIG. 4 illustrates an electronic interconnect structure.
Figure 5:
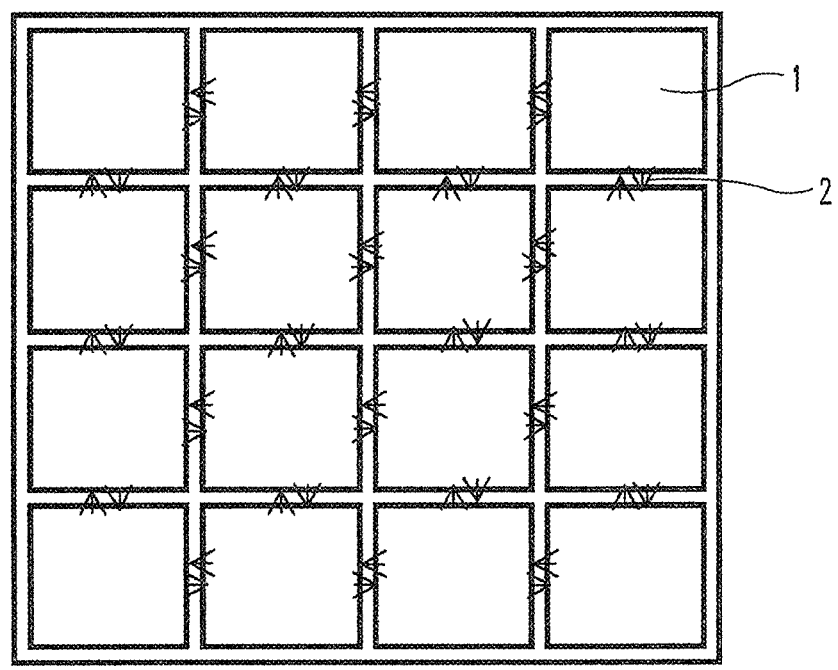
FIG. 5 illustrates an electronic device containing a plurality of electronic interconnect structures.

For copper and silicon oxide etch rate tests, 2 cm by 3 cm coupons were employed in the present examples. The coupons comprised silicon substrates with a layer of copper (for the copper etch rates) or a layer of silicon oxide (for the silicon etch rates). A third set of 2 cm by 3 cm test coupons had the cross-sections shown in FIG. 6 with a toplayer of developed photoresist thereon and developed photoresist in the trenches between the individual chips on the wafer as shown. Removing the photoresist from the trenches is particularly challenging for cleaning compositions.

The etch rate and cleaning performance tests were both run using 100 g of the stripper/cleaning compositions in a 150 ml beaker with ¼" round Teflon stir bar set at 600 rpm. The compositions were heated to a temperature of about 40° C. on a hot plate. The test coupons were immersed in the compositions for about 5 minutes while stirring. The segments were then rinsed for 3 minutes in a DI water bath or spray and subsequently dried by directing a stream of filtered nitrogen at the coupons.

The copper and silicon oxide etch rates were estimated from changes in the thickness before and after etching, copper was measured by 4 point probe resistivity measurement, and silicon oxide was measured by NanoSpec reflectometer. Typical starting layer thickness was 1000 Å for copper and 7000 Å for $SiO_2$. Pattern wafer clean performance was checked by optical microscope (OM) and scanning electron microscopy (SEM). The unsuccessful cleaning results produced using the Comparative Example 1 composition is shown in FIG. 1A which is an optical magnified edge surface of the test coupon cleaned using Comparative Example 1. The unsuccessful cleaning results produced using the Comparative Example 2 composition is shown in FIG. 1B which is an optical magnified edge surface of the test coupon cleaned using Comparative Example 2. The unsuccessful cleaning results produced using the Comparative Example 3 composition is shown in FIG. 2A which is an optical magnified edge surface of the test coupon cleaned using Comparative Example 3.

| Components | Example A | Example B | Example C | Example D | Example E |
|---|---|---|---|---|---|
| HA (50 wt % aqueous solution) | 2.00 | 2.00 | 2.00 | 2.00 | 2.00 |
| TEAH (35 wt % aqueous solution) | 5.00 | 5.00 | 10.00 | 10.00 | 37.00 |
| BZT | 1.00 | 1.00 | 1.00 | 1.00 | 1.00 |
| DMSO | 92.00 | 91.75 | 86.75 | 87.00 | 60.00 |
| Surfynol 485 | 0.00 | 0.25 | 0.25 | 0.00 | 0.00 |
| Total | 100.00 | 100.00 | 100.00 | 100.00 | 100.00 |
| Temperature ° C. | 40 | 40 | 40 | 40 | 40 |
| 5% pH | — | 11.39 | 11.8 | 11.96 | 12.69 |

-continued

| Components | Example A | Example B | Example C | Example D | Example E |
|---|---|---|---|---|---|
| 10 min TEOS film loss (Å) | <2 | <2 | <2 | <2 | <2 |
| 10 min Cu film loss (Å) | 23.9 | 24.7 | 31.8 | 25.03 | 31.10 |

Examples

Example D and E provided good cleaning results.

Comparative Examples

| Raw Material | Comparative Example 1 | Comparative Example 2 | Comparative Example 3 |
|---|---|---|---|
| Added DIW | 29.25 | 29.25 | 0.00 |
| Ammonium acetate | 2.60 | 2.60 | 0.00 |
| Acetic acid | 2.00 | 2.00 | 0.00 |
| BZT | 1.00 | 1.00 | 1.00 |
| TEAH (35 wt % aqueous solution) | 0.00 | 0.00 | 5.00 |
| NH$_4$F (40 wt % aqueous solution) | 1.25 | 0.00 | 0.00 |
| DMSO | 0.00 | 0.00 | 94.00 |
| NMP | 63.90 | 65.15 | 0.00 |
| Total | 100.00 | 100.00 | 100.00 |
| Temperature (° C.) | 40 | 40 | 40 |
| 5% pH | 4.76 | 4.77 | 11.23 |
| 10 mins TEOS film loss (Å) | 355.7 | <2 | <2 |
| 10 mins Cu film loss (Å) | 23.7 | 48.7 | 18.8 |

| Components | RM assay, wt % | Comparative Example 4 | Comparative Example 5 |
|---|---|---|---|
| HA | 50 | 2.00 | 2.00 |
| TEAH | 35 | 5.00 | 5.00 |
| BZT | | 1.00 | 1.00 |
| DMSO | | 0.00 | 0.00 |
| DMAC | | 91.75 | 0.00 |
| NMP | | 0.00 | 91.75 |
| Surfynol485 | | 0.25 | 0.25 |
| Total | | 100.00 | 100.00 |
| Temperature (° C.) | | 40 | 40 |
| 5% pH | | | |
| 10 mins TEOS film loss (Å) | | <2 | <2 |
| 10 mins Cu film loss (Å) | | 291.63 | 273.23 |

| Components | RM assay, wt % | Comparative Example 6 | Comparative Example 7 | Comparative Example 8 |
|---|---|---|---|---|
| HA | 50 | 2.00 | 2.00 | 2.00 |
| TEAH | 35 | 0.00 | 0.00 | 0.00 |
| ETMAH | 20 | 5.00 | 0.00 | 0.00 |
| Triton B | 40 | 0.00 | 5.00 | 0.00 |
| MEA | | 0.00 | 0.00 | 5.00 |
| BZT | | 1.00 | 1.00 | 1.00 |
| DMSO | | 91.75 | 91.75 | 91.75 |
| Surfynol485 | | 0.25 | 0.25 | 0.25 |
| Total | | 100.00 | 100.00 | 100.00 |
| Temperature (° C.) | | 40 | 40 | 40 |
| 5% pH | | | | |
| 10 mins TEOS film loss (Å) | | <2 | <2 | <2 |
| 10 mins Cu film loss (Å) | | 264.33 | 19.40 | 732.10 |

*Comparative Example 7 did not satisfactorily clean the wafer.

The cleaning result produced using the Example A composition is shown in FIG. 2B which is an optical magnified edge surface of the test coupon cleaned using Example A. Example A is not fully cleaned but is better than the results using the Comparative Example cleaning compositions. The successful cleaning results produced using the Example B composition is shown in FIG. 2C which is an optical magnified edge surface of the test coupon cleaned using Example B. The successful cleaning results produced using the Example C composition is shown in FIG. 2D which is an optical magnified edge surface of the test coupon cleaned using Example C. FIG. 3A shows a wafer sidewall that was cleaned using the Example B cleaning composition, that is not completely cleaned; however FIG. 3B shows a completely cleaned wafer side wall using Example C cleaning composition.

The use of the open terms comprising or comprises, having and containing when describing the composition and method of this invention are not restricted to the listed components or method steps, respectively, and may include additional components and/or steps. Comprising and the other open terms include the more restrictive consisting essentially of and the closed term consisting of; therefore anywhere comprising is the terms consisting essentially of and consisting of are included in the alternative.

While the invention has been described in detail above with reference to specific embodiments, it will be understood that modifications and alterations in embodiments disclosed may be made by those practiced in the art without departing from the spirit and scope of the invention. All such modifications and alterations are intended to be covered as well as any combination of the above-described components and steps in all possible variations thereof unless otherwise indicated herein or otherwise clearly contradicted by context. In addition, all publications cited herein are indicative of the level of skill in the art and are hereby incorporated by reference in their entirety as if each had been individually incorporated by reference and fully set forth.

The invention claimed is:

1. A stripper solution for removing a resist from a substrate consisting of the following ingredients
   about 60 wt % to about 90 wt % of dimethyl sulfoxide,
   water,
   about 0.1 wt % to about 5.0 wt % of hydroxylamine,
   about 1.0 wt % of benzotriazole,
   optionally 0.001 to 1 wt % of one or more than one non-ionic surfactant,
   optionally an additional corrosion inhibitor, and
   about 1.75 wt % to about 13 wt % of neat tetraethyl ammonium hydroxide

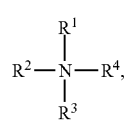

wherein the ingredients do not exceed 100 wt % of the solution.

2. The stripper solution of claim 1 wherein the striper solution has a pH of about 11.5 to about 12.75.

3. The stripper solution of claim 1, which has about 1.75 wt % of neat tetraethylammonium hydroxide.

4. The stripper solution of claim 1, which has about 3.5 wt % of neat tetraethylammonium hydroxide of.

5. The stripper solution of claim 1, which has about 12.95 wt % of neat tetraethylammonium hydroxide.

6. The stripper solution of claim 1, which has about 1.75 to about 3.75 wt % of neat tetraethylammonium hydroxide.

7. The stripper solution of claim 1, which has about 3.75 wt % to about 13 wt % of neat tetraethylammonium hydroxide.

8. The stripper solution of claim 1, comprising about 1 wt % to about 2.0 wt % of hydroxylamine.

9. The stripper solution of claim 1, which has about 1 wt % to about 2.0 wt % of hydroxylamine and about 3.5 wt % to about 13 wt % of neat tetraethylammonium hydroxide.

10. The stripper solution of claim 9, which has about 60 wt % of dimethyl sulfoxide.

11. The stripper solution of claim 1, wherein the additional corrosion inhibitor is present and is selected from the group consisting of carboxybenzotriazole, amino-benzotriazole, D-fructose, t-butyl catechol, L-ascorbic acid, vanillin, salicylic acid, diethyl hydroxylamine, poly(ethyleneimine), o-tolyltriazole, m-tolyltriazole, p-tolyltriazole and 2-mercaptobenzimidazole.

12. The stripper solution of claim 9, which has about 87 wt % of dimethyl sulfoxide.

13. The stripper solution of claim 1, which has from about 1 to about 15 wt % of neat quaternary ammonium hydroxide and from about 1 to about 15 wt % water.

14. The stripper solution of claim 1, wherein the non-ionic surfactant is present and is selected from the group consisting of bis(2-ethylhexyl)phosphate, perfluoroheptanoic acid, prefluorodecanoic acid, trifluoromethanesulfonic acid, phosphonoacetic acid, dodecenylsuccinic acid, dioctadecyl hydrogen phosphate, octadecyl dihydrogen phosphate, dodecylamine, dodecenylsuccinic acid monodiethanol amide, lauric acid, palmitic acid, oleic acid, juniperic acid, 12 hydroxystearic acid, dodecyl phosphate and acetylene glycol surfactant.

15. The stripper solution of claim 1, wherein water is present in an amount from about 3.5 wt % to about 9 wt % of the composition; and the hydroxylamine is present in an amount of more than about 1 wt % but less than about 2 wt % of the composition.

16. A method for removing a resist from a substrate comprising: (a) providing a substrate having a resist thereon; (b) contacting the substrate with a stripper solution of claim 1 for a time sufficient to remove the resist; (c) removing the substrate from the stripping solution; and (d) rinsing the stripper solution from the substrate with a solvent.

17. The method of claim 16, wherein contacting the substrate with the stripper solution of claim 1 comprises immersing the substrate in the stripping solution with agitation or spraying the stripper solution on the substrate at a temperature of at least about 40° C.

18. The method of claim 16, wherein contacting the substrate with the stripper solution of claim 1 comprises immersing the substrate in the stripping solution with agitation or spraying the stripper solution on the substrate at a temperature of less than 40° C.

19. The method of claim 16, wherein the stripper solution of claim 1 has about 3.75 wt % to about 13 wt % of neat tetraethylammonium hydroxide.

20. The method of claim 16, wherein the water is present in the stripper solution of claim 1 in an amount from about 3.5 wt % to about 9 wt %; and the hydroxylamine is present in said stripper solution in an amount from about 1 wt % to less than about 2 wt %.

* * * * *